United States Patent [19]

Righi et al.

[11] 4,279,170
[45] Jul. 21, 1981

[54] PUSHBUTTON TUNER

[75] Inventors: Nardino Righi; Mario C. Ferrari, both of Milan, Italy

[73] Assignee: Ri-El Richerche Eiettroniche S.p.A., Cologno Monzese, Italy

[21] Appl. No.: 60,520

[22] Filed: Jul. 25, 1979

[30] Foreign Application Priority Data

Jul. 28, 1978 [IT] Italy ............................... 12729 A/78

[51] Int. Cl.³ .......................... H03J 5/12; G05G 1/02
[52] U.S. Cl. ..................................... 74/10.33; 74/422; 334/7
[58] Field of Search .................... 74/10.33, 10.37, 422; 334/7

[56] References Cited
U.S. PATENT DOCUMENTS

| | | | |
|---|---|---|---|
| 3,703,833 | 11/1972 | Olah | 334/7 X |
| 3,943,779 | 3/1976 | Ganderton | 74/10.33 |
| 4,106,351 | 8/1978 | Santoro | 74/10.33 |
| 4,189,949 | 2/1980 | Righi et al. | 334/7 |
| 4,205,557 | 6/1980 | Kantner | 74/10.33 |

FOREIGN PATENT DOCUMENTS 45-36528 11/1970 Japan ....................................... 74/10.33

Primary Examiner—Allan D. Herrmann
Attorney, Agent, or Firm—Edwin E. Greigg

[57] ABSTRACT

The pushbutton tuner comprises a plurality of pushbutton assemblies arranged side by side and parallel to each other. Each pushbutton assembly is movable in its longitudinal direction towards and away from a control bar slidably arranged transversely with respect to the pushbutton assemblies and operatively connected with the tuner group of the radio set. The improvement resides in the fact that the transverse control bar carries an abutment pin for each pushbutton assembly, while each pushbutton assembly carries a V-shaped notch presenting two inclined edges which are intended to cooperate with the respective abutment pin provided on the transverse control bar. In this manner, whenever a pushbutton assembly is pushed for the selection of the desired frequency associated thereto, one of the inclined edges of the V-shaped notch will abut against the respective abutment pin on the transverse control bar, and promote its shifting in longitudinal direction, until the other one of the inclined edges of the V-shaped notch also abuts against the abutment pin.

10 Claims, 8 Drawing Figures

PUSHBUTTON TUNER

BACKGROUND OF THE INVENTION (1) Field of the Invention

The present invention relates to a pushbutton tuner for radio sets, television sets and other apparatus, and particularly for automobile radio sets or the like. A pushbutton tuner of this type presents a plurality of pushbutton assemblies mounted on the tuner frame for in and out movement, each one of these pushbutton assemblies carrying adjustable memory means for recalling a memorized broadcast frequency when the pushbutton assembly is pushed inwardly.

(2) Statement of the Prior Art Known to the Applicants

The following prior art is known to the applicants:

U.S. Pat. No. 4,030,052 (PELLETIER): the whole document.

German (Federal Republic) Publication of Patent Application (OS) No. 2,614,610: the whole document.

(3) Prior Art Pushbutton Tuners

Conventional pushbutton tuners comprise a plurality of pushbutton assemblies arranged side by side and parallel to each other, longitudinally slidable inside a tuner frame, and each carrying one abutment member which can be angularly adjusted around an axis which is perpendicular to the plane of the pushbutton assembly, and is associated to means for locking or unlocking same so as to adjust its angular position at will and maintain such position once adjusted. Each pushbutton assembly cooperates, by means of its abutment member, with the inclined edges of a V-shaped notch obtained in a control bar transversely arranged with respect to the pushbutton assemblies, said control bar being operatively associated to the tuner group of the radio set, so as to actually control same as a consequence of its longitudinal movement promoted by the insertion of any pushbutton assembly and by the consequent action of the abutment member on the inclined edge of the V-shaped notch.

In the pending U.S. application Ser. No. 924,485 filed in the name of the same applicants as in the present invention, there is disclosed a pushbutton tuner which comprises a plurality of pushbutton assemblies arranged side by side parallel to each other. Each pushbutton assembly carries a supporting member onto which there are provided two abutment members. Each supporting member is mounted rotatably and angularly adjustable on the corresponding pushbutton assembly, and can be locked to any desired angular position with respect to the longitudinal axis of the pushbutton assembly. Whenever a pushbutton assembly is pushed inwardly for the selection of a desired predetermined broadcast frequency, firstly one of the said two abutment members abuts against an inclined edge of a V-shaped notch provided on the longitudinal side of a control bar operatively associated to the tuner group of the radio set, thus promoting the shifting of the said control bar in its longitudinal direction, until the second one of the said abutment members abuts against the other inclined edge of the said V-shaped notch of the control bar, thus stopping the movement of the control bar itself.

SUMMARY OF THE INVENTION

According to the present invention, there is provided a pushbutton tuner which comprises a plurality of pushbutton assemblies arranged side by side and parallel to each other. Each pushbutton assembly is movable in its longitudinal direction towards and away from a control bar slidably arranged transversely with respect to the pushbutton assemblies and operatively connected with the tuner group of the radio set. The improvement resides in the fact that the transverse control bar carries an abutment pin for each pushbutton assembly, while each pushbutton assembly carries a V-shaped notch presenting two inclined edges which are intended to cooperate with the respective abutment pin provided on the transverse control bar. In this manner, whenever a pushbutton assembly is pushed for the selection of the desired frequency associated thereto, one of the inclined edges of the V-shaped notch will abut against the respective abutment pin on the transverse control bar, and promote its shifting in longitudinal direction, until the other one of the inclined edges of the V-shaped notch also abuts against the abutment pin.

According to a characterizing feature of the invention, the V-shaped notch of each pushbutton assembly is defined by the intersecting inclined edges of two plates which are mounted movable and adjustable in the longitudinal direction on the said pushbutton assembly. In this manner, it is possible to modify at will the position of the vertex of the V-shaped notch transversely with respect of the direction of movement of the pushbutton assembly, and consequently modify the displacement of the control bar caused by the engagement of the said V-shaped notch with the respective abutment pin provided on the control bar.

The above and other features of the invention, and the advantages deriving therefrom, will appear evident from the following detailed description of two preferred embodiments, made with reference to the attached drawings.

DESCRIPTION OF THE PREFERRED EMBODIMENT

Figure 1:
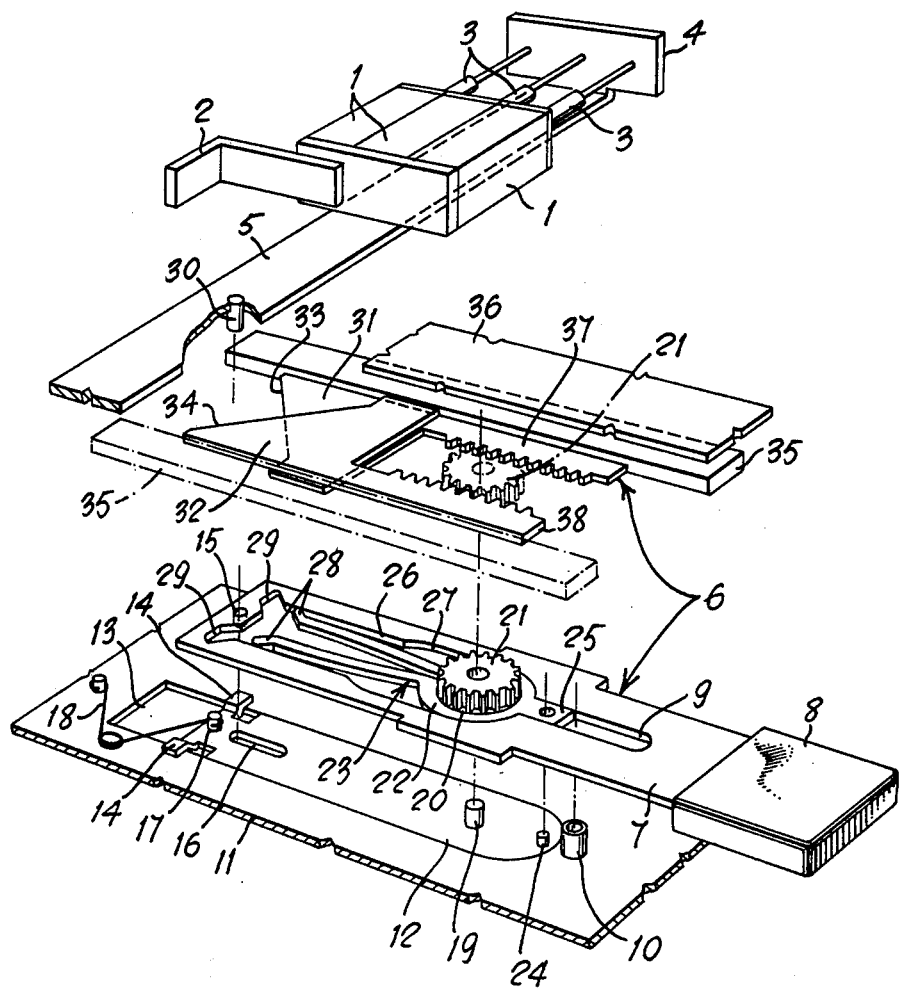
FIG. 1 is an exploded perspective view of a pushbutton assembly of a pushbutton tuner according to the invention, together with the respective portion of the transverse control bar associated to the tuner group of the radio set.

With reference to FIGS. 1 to 7, the frequency selector device or tuner for radio sets, television sets and other apparatus, particularly for automobile radio sets or the like, comprises a plurality of electrical coils 1 mounted in a fixed manner by means of the angle bar 2, presenting cores 3 which are axially movable and can be inserted according to variable measures within the coils 1 so as to consequently modify the tuning frequency. To this purpose, the cores 3 are secured to a movable supporting member 4 which is operatively connected to a slidable control bar 5. In the diagrammatic example illustrated in FIG. 1, the control bar 5 is directly connected to the supporting member 4 of the cores 3. Practically, however, the operative connection between the supporting member 4 of the cores 3 and the slidable control bar 5 will be effected through a mechanism which comprises also the manual tuning control and it is obtained in such a manner that, whenever the movable supporting member 4 is shifted by means of the manual tuning control, also the control bar 5 is shifted in a corresponding manner. On the contrary, whenever the movable supporting member 4 is shifted by means of the pushbutton tuner, through the slidable control bar 5, then the manual tuning control is disconnected or anyhow excluded. This type of mechanism is known, and for example it is illustrated in the U.S. application Ser. No. 924,485 in the name of the same applicants as in the present invention.

The slidable control bar 5 extends transversely with respect to a plurality of pushbutton assemblies 6 arranged side by side and parallel to each other, only one pushbutton assembly being shown in FIGS. 1 to 7. Each pushbutton assembly 6 consists of a thin slide 7 which is provided with an outer actuation head (pushbutton) 8 and it is guided slidable in the longitudinal direction of the pushbutton assembly, i.e. transversely with respect to the slidable control bar 5. For this purpose, the slide 7 of the pushbutton assembly 6 may present a longitudinal slot 9 which is engaged by a pin 10 fixed to a base plate 11.

Under the slide 7 of the pushbutton assembly 6 there is provided an additional slide element 12 which is slidably housed in the longitudinal direction of the pushbutton 6 in a corresponding slot 13 provided in the base plate 11. Corresponding to its rear end, the slide element 12 presents two side guide flanges 14 which are superposed over the base plate 11. The slide element 12 is coupled to the slide 7 of the pushbutton assembly 6 in a relatively slidable manner within certain limits in the longitudinal direction of the pushbutton. To this purpose, the pushbutton slide 7 carries a pin 15 which engages a longitudinal slot 16 of the slide 12. On a pin 17 provided at the rear end of the slide element 12 there acts a return spring 18 which tends to displace the slide element 12 towards the exterior and to bring it to a rest position of the pushbutton assembly, shown in FIG. 2.

Onto a pin 19 fixed to the slide element 12 there is rotatably mounted a small circular disc 20 which is integral with a gear 21 and it is encircled and tightly clasped by the eyelet-shaped head 22 of a fork spring 23, secured to the underlying slide element 12 by means of a pin 24 in correspondence of a front extension 25 of the eyelet head 22. The fork spring 23 and the disc 20 clasped by the eyelet head 22 of said spring are housed in a longitudinal opening 26 of the slide 7 of the pushbutton assembly 6, while the gear 21 projects upwardly from slide 7. The longitudinal opening 26 presents a forward end 27 which is slightly enlarged and with the edges parallel to each other, and inside which there is housed and it can longitudinally slide within certain limits the eyelet head 22 of the fork spring 23, together with the disc 20 which carries the gear 21. The free rear ends 28 of the two arms of the fork spring 23 are outwardly bent and elastically bear against the respective edges of the opening 26. The rear end 29 of the opening 26 presents a V-shaped enlargement, or it presents two deep, opposed side notches.

To each pushbutton assembly 6 there is associated an abutment pin 30 secured to the transverse control bar 5. Each pushbutton assembly comprises moreover two small plates 31,32 partially superposed the one over the other and over the slide 7, and each presenting, on their side directed towards the transverse control bar 5, an inclined edge 33,34, intended to cooperate with the respective abutment pin 30 of the control bar 5. The edges 33,34 of the two plates 31,32 are inclined in opposed directions, so as to define a V-shaped notch. The plates 31,32, are slidably guided in the longitudinal direction of the pushbutton assembly 6, for example by means of side guide projecting strips 35 secured to an upper cover plate 36. The two plates 31,32 present rack-shaped extensions 37,38 which extend along diametrally opposed sides of the gear 21 and mesh with the said gear.

Each pushbutton assembly 6 is associated to a predetermined selected frequency, at which the tuner group 1,3 is automatically adjusted by means of the transverse control bar 5 when the pushbutton assembly 6 is pushed inwardly from its rest position. In this rest position illustrated in FIG. 2, the V-inclined edges 33,34 of the two plates 31,32 are out of engagement from the abutment pin 30 of the transverse control bar 5, so that this bar 5 may freely slide when the tuning to the desired frequency is manually effected. The gear 21 is locked in non-rotatable manner. In fact, the slide element 12 and the slide 7 of each pushbutton assembly 6 are in a position at which the fork spring 23 is positioned forwardly inside the longitudinal opening 26,27 of the slide 7, i.e. towards the actuation head 8 of the pushbutton assembly 6. Consequently, the ends 28 of the two arms of the fork spring 23 are positioned in the narrower zone of the said opening 26 and are brought close to each other, and in this manner the eyelet head 22 of the spring 23 clasps the disc 20 and locks same together with the gear 21.

Figure 3:
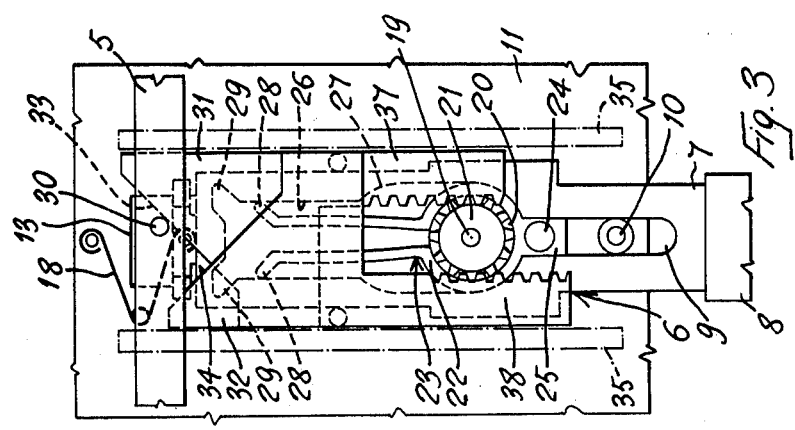
Figure 4:
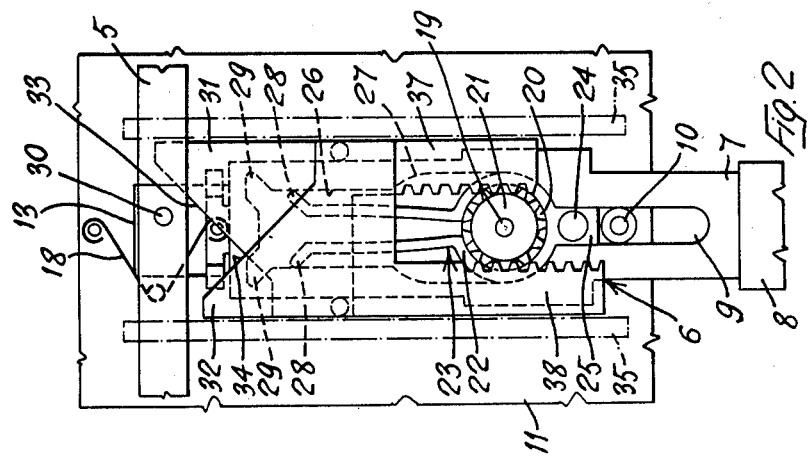

In order to select a desired transmitting station by means of the pushbutton, the pushbutton assembly 6 associated with the desired frequency is pushed inwardly. The slide 7 entrains immediately also the underlying slide element 12 by means of the pin 15 located in correspondence of the rear end of slot 16. Together with the slide 7 there are moved also the two plates 31,32 which at this moment are rigidly connected the one to the other and also to the slide element 12 by means of the gear 21 which is locked in non-rotatable manner. Usually, in the course of the said movement, one of the inclined edges 33,34 of the plates 31,32, and for example the edge 33 of plate 31, abuts against the abutment pin 30 of the transverse control bar 5, as illustrated in FIG. 3, and it shifts said control bar, for example to the left (referring to FIGS. 2 to 4). During said shifting, the abutment pin 30 of the control bar 5 slides on the inclined edge against which it abutted, and comes to be housed, at the end of the movement, in correspondence of the angle (vertex) of the V-shaped notch formed by the two inclined edges 33,34 of the two plates 31,32, as illustrated in FIG. 4. The control bar 5 is therefore shifted and brought with the maximum accuracy to a position which corresponds to the frequency associated to the pushbutton assembly 6, thus adjusting the tuner group 1,3 to the selected frequency. By letting free the actuated pushbutton assembly 6, this latter is again brought by the respective return spring 18 and by the pin 17 to its rest position shown in FIG. 2.

Figure 2:
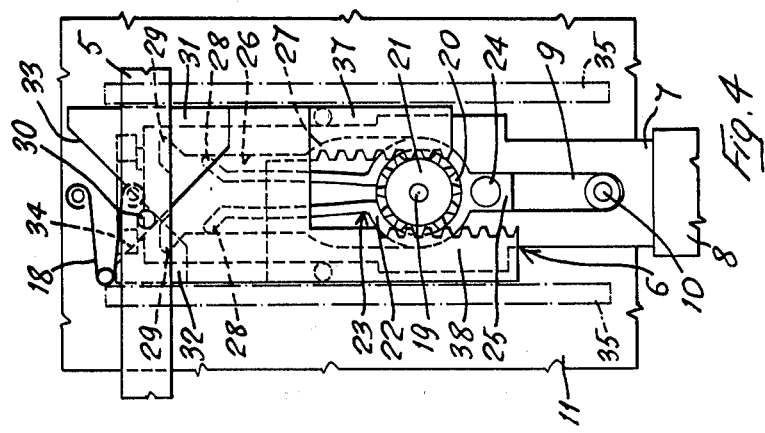
FIGS. 2, 3 and 4 are top views illustrating three subsequent positions of a pushbutton assembly at the moment of the insertion of a predetermined frequency associated thereto.
Figure 5:
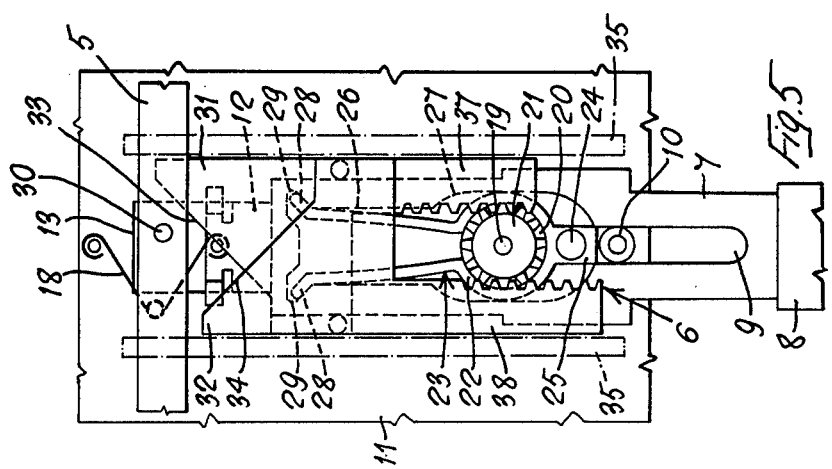

In order to change and pre-arrange a frequency associated to a pushbutton assembly 6, the same is pulled outwardly from its rest position of FIG. 2 and brought to a position of unlocking of gear 21, illustrated in FIG. 5. In the rest position of pushbutton assembly 6 the slide element 12 adheres with its rounded forward end against the correspondingly shaped end of opening 13 provided in the base plate 11. Consequently said slide element 12, the small disc 20 and the gear 21, as well as the fork spring which clasps, with its eyelet-shaped head 22, the disc 20, cannot follow the said outward movement of pushbutton assembly 6 and therefore effect a rearward motion *relatively* to the slide element 7. The gear-carrying disc 20 and the fork spring 23 move, during said relative motion, along the longitudinal opening 26,27 of the slide 7 and assume, at the end of said relative motion, an unlocking position, at which the ends 28 of the fork spring 23 come to be housed inside the enlarged rear end 29 of the said opening 26 and therefore open out the one apart from the other, as illustrated in FIG. 5. Said opening apart of the ends 28 and consequently of the arms of the spring 23 causes a slackening of the clasp exerted by the eyelet head 22 of the fork spring 23 on the gear-carrying disc 20, so that the said disc is unlocked, i.e. it can freely rotate inside the eyelet head 22 of spring 23, on pin 19 and together with gear 21.

In this unlocked position of the gear-carrying disc 20, the radio set is tuned, by means of the manual control, at the new broadcast frequency which is to be associated to the pushbutton assembly 6, thus shifting the transverse bar 5 to a position corresponding to said frequency, for example from the position according to FIG. 4 to the position according to FIG. 5. Subsequently, the pushbutton assembly is pushed inwardly from the position of FIG. 5 to the position of FIG. 6, thus drawing along the slide element 12 together with the disc 20 and the fork spring 23, since the outwardly bent ends 28 of the arms of the spring 23 engage the corresponding side notches of the rear end 29 of the opening 26 of the slide 7 of pushbutton assembly 33, thus coupling said slide 7 to the slide element 12.

During said inward movement of the pushbutton assembly 6, the inclined edge 33 or 34 of one of the two plates 31, 32 (in the illustrated example the inclined edge 33 of plate 31) abuts first (with respect to the other) the abutment pin 30 of the transverse bar 5. In consideration of the fact that the gear 31 is now freely rotatable together with the disc 20, the inclined edge 33 abutting against the abutment pin 30 of the transverse bar 5 does not promote the shifting of said transverse bar 5, but it is stopped and it causes the relative displacement of the corresponding plate 31 with respect to the slide 7 of the pushbutton assembly 6 which continues its movement towards the transverse bar 5. The said relative movement causes the rotation of gear 21 which is following the inward movement of the slide 7 of the pushbutton assembly 6 and of the slide element 12, by rolling on the rack extension 37 of the plate 31 which has been stopped due to abutment of its inclined edge 33 with the pin 30 of transverse bar 5. Consequently, the rotating gear 21 acts on the rack extension 38 of the other plate 32, and it causes the displacement of said plate 32 towards the transverse bar 5 with respect to the slide 7 and to the slide element 12 of the pushbutton assembly 6, until also the said plate 32 comes to abut with its inclined edge 34 against the abutment pin 30 of the transverse bar 5. In this manner, also the movement of the other plate 32 is stopped, and its inclined edge 34 forms, together with the inclined edge 33 of plate 31, a V-shaped notch, which houses, in its bottom angle, the abutment pin 30 of the transverse bar 5. To sum up, it can be noted that the vertex of the V-shaped notch formed by the inclined edges 33,34 of the two plates 31,32 was initially offset (out of longitudinal alignment) with respect to the abutment pin 30 in the position of the transverse bar 5, corresponding to the new frequency to be associated to the pushbutton assembly 6, as it results from FIG. 5. By freeing the rotation of gear 21 and pushing inwardly the pushbutton assembly 6 to the position shown in FIG. 6, there is obtained automatically a side displacement of the vertex of the V-shaped notch formed by the inclined edges 33,34 of the plates 31,32 so that the said vertex comes to be longitudinally aligned with the abutment pin 30, as it precisely results from FIG. 6.

Figure 7:
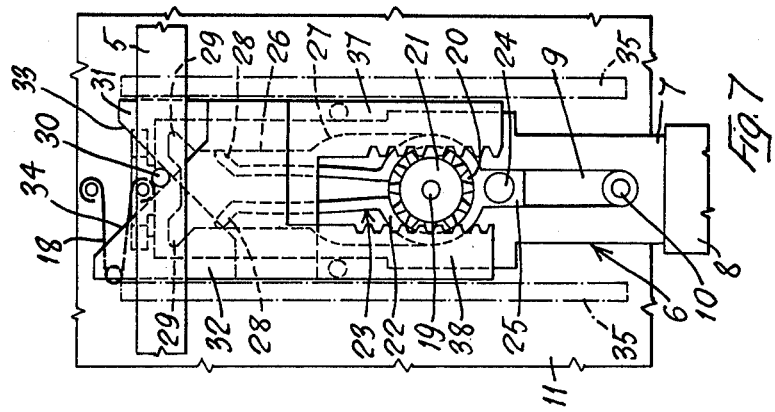
FIGS. 5, 6 and 7 are top views illustrating three subsequent positions of the same pushbutton assembly at the moment of the changement to a new broadcast frequency.
Figure 6:
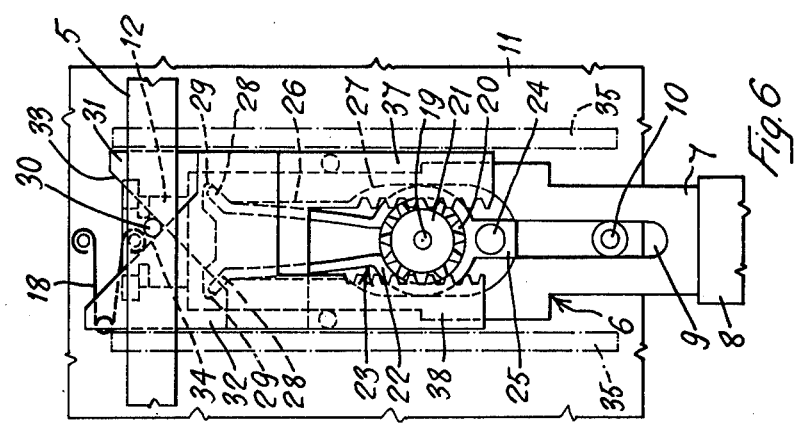

By further prosecuting the inward movement of the pushbutton assembly 6, from the intermediate position of FIG. 6 to the final position of FIG. 7, only the slide 7 is shifted, since the slide element 12 is stopped thanks to the gear 21. In fact, whenever both plates 31,32 abut with their inclined edges 33,34 against the abutment pin 30 of the transverse bar 5, they do not permit the rotation of the gear 21 which thus determines a rigid connection between the said plates 31,32 and the slide element 12. The gear-carrying disc 20 and the fork spring 23 therefore do not move any more, while the slide 7 of the pushbutton assembly 6 moves further inwardly. Consequently, the spring 23 and the disc 20 move *relatively* with respect to the slide 7 of the pushbutton assembly towards the exterior, i.e. towards the forward end of the opening 26, and assume their rest position with respect to the slide 7, at which position the ends 28 of the two arms of the fork spring 23 are withdrawn from the enlarged rear end 29 of the said opening 26 towards the narrower portion of the said opening, as illustrated in FIG. 7. In this manner, the ends 28 of the two arms of the fork spring 23 are again brought close to one another, so that the spring 23 clasps by means of its eyelet head 22 the gear-carrying disc 20 in such a manner as to again lock same and to avoid its rotation and consequently the rotation of gear 21. By letting free the pushbutton assembly 6, same is brought again under the action of return spring 18 to the rest position of FIG. 3, together with the slide element 12 and consequently with the disc 20, as well as with the plates 31,32 and the blocked gear 21. The plates 31,32 maintain their relative position. Consequently, each time that the pushbutton assembly 6 is pushed inwardly (as described with reference to FIGS. 2 to 4) the plates 31,32, thanks to their inclined edges 33,34, will again cause the shifting of the control bar 5 of the tuner group to the same position and will therefore insert the same frequency associated to said position.

MODIFICATIONS

Figure 8:
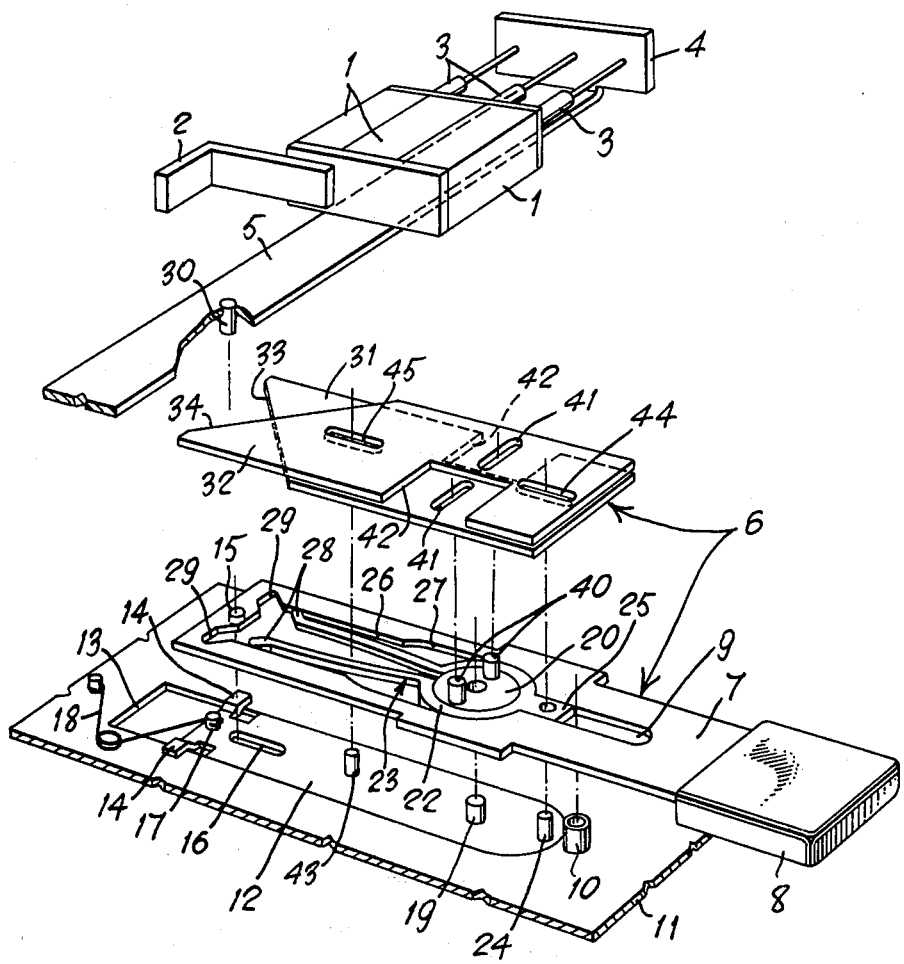
FIG. 8 is an exploded perspective view of another embodiment of the pushbutton assembly of a pushbutton tuner according to the invention, with the respective portion of the transverse control bar associated to the tuner group of the radio set.

The embodiment shown in FIG. 8 substantially corresponds to the one shown in FIGS. 1 to 7, and the same reference numerals identify identical parts. The difference resides in the fact that, instead of the gear 21, on the small disc 20 there are secured two entraining pins 40, along the same circumference concentrically to the rotation axis 19 of the disc and diametrally opposed, each one of the said entraining pins 40 engaging a transverse slot 41 provided in each of the two plates 31,32 and extending parallel to the transverse control bar 5. In correspondence of the transverse slot 41 of each plate 31,32 there is provided a large recessed portion or opening 42 so that upon displacement of the said plates 31,32 there will be no interference between the entraining pins 40 and the same plates. The two entraining pins 40 provided on disc 20 and engaging the slots 41 of the two plates 31,32, practically determined a coupling between the said plates which is similar to the coupling obtained (in the preceding embodiment) by means of the gear 21 and of the rack extensions 37,38. In fact, whenever the disc is free to rotate the two plates move simultaneously in opposite directions, while they are locked in their relative position whenever the disc 20 is clasped inside the eyelet head 22 of the fork spring 23.

Moreover, in the embodiment according to FIG. 8, the two superposed plates 31,32 are guided by the pin 19 and by an additional pin 43, both provided on the slide element 12, and engaging corresponding longitudinal superposed slots 44 respectively 45 of the said plates 31,32.

It is believed that the invention will have been clearly understood from the foregoing detailed description of two preferred embodiments. Changes in the details of construction may be resorted to without departing from the spirit of the invention, and it is accordingly intended that no limitation be implied and that the hereto annexed claims be given the broadest interpretation to which the employed language fairly admits.

We claim:

1. A pushbutton tuner particularly adapted for automobile radio sets, comprising a plurality of pushbutton assemblies arranged side by side and parallel to each other, each pushbutton assembly being movable in its longitudinal direction toward and away from a control bar slidably arranged transversely with respect to the pushbutton assemblies and operatively connected with the tuner group of the radio set, wherein the improvement comprises of the fact that the transverse control bar carries at least one abutment element for each pushbutton assembly, while each pushbutton assembly carries two plates presenting inclined edges which intersect each other so as to form a V-shaped notch, at least one plate being movable and adjustable with respect to the other in the longitudinal direction of the pushbutton assembly, said V-shaped notch adapted to cooperate with the respective abutment element provided on the transverse control bar, whereby, whenever a pushbutton assembly is pushed to a position for the selection of the desired frequency, one of the said inclined edges of the V-shaped notch of the pushbutton assembly abuts against the respective abutment element on the control bar and promotes the shifting of said transverse control bar in its longitudinal direction, until the other one of said inclined edges of the V-shaped notch abuts against said abutment element.

2. A pushbutton tuner according to claim 1, in which both plates presenting the inclined edges are movable in the longitudinal direction of the pushbutton assembly, and are coupled to each other by coupling means which cause their simultaneous movement in opposite longitudinal directions.

3. A pushbutton tuner according to claim 2, in which the two plates presenting the inclined edges are provided each with a rack-shaped extension extending in the longitudinal direction of the pushbutton assembly, the said rack-shaped extensions being coupled to each other by means of an interposed gear wheel secured onto a supporting element which is mounted angularly adjustable on the pushbutton assembly.

4. A pushbutton tuner according to claim 2, in which the two plates presenting the inclined edges present each a transverse slot extending transversely with respect to the longitudinal direction of the pushbutton assembly, each of said transverse slots being engaged by a respective entraining pin, the said entraining pins being secured onto a supporting element which is mounted angularly adjustable on the pushbutton assembly.

5. A pushbutton tuner according to claim 4, in which the supporting element of the two entraining pins consists of a disc rotatably mounted on the pushbutton assembly, and the said two entraining pins are secured to said disc diametrally opposed the one with respect to the other, along a circumference which is concentric to the axis of rotation of the said disc.

6. A pushbutton tuner according to claims 3 or 4, in which the supporting element consists of a disc rotatably mounted on the pushbutton assembly.

7. A pushbutton tuner according to claim 6, in which the disc is clasped by the eyelet head of a fork spring, means being provided for opening apart the arms of said fork spring, in such a manner to permit the rotation of said disc, further means being provided for closing or drawing near the said arms of the fork spring, in such a manner as to lock the disc against rotational movement.

8. A pushbutton tuner according to claim 7, in which the disc and the fork spring are housed in a longitudinal opening obtained in a first slide of the pushbutton assembly, and are mounted on an additional slide element which is slidably guided in the longitudinal direction of the pushbutton assembly, and coupled to the said first slide in such a manner as to be capable of sliding with respect to the said first slide in the same longitudinal direction so as to move from a locking position, in which the extremities of the arms of the fork spring are positioned in a narrow portion of the said longitudinal opening, and therefore are near the one to the other, to an unlocking position in which the extremities of the arms of the fork spring are positioned in an enlarged portion of the said longitudinal opening, and therefore are opened apart from each other.

9. A pushbutton tuner according to claim 8, in which the longitudinal movement of the additional slide element with respect to the first slide is limited by a pin secured to either one of the said two above mentioned components and engaging a slot provided in the other one of the said components.

10. A pushbutton tuner according to claim 8, in which the extremities of the arms of the fork spring are outwardly bent, and are intended to engage corresponding recesses or notches obtained in the sides of the said longitudinal opening of the first slide.

* * * * *